United States Patent [19]

Drummond et al.

[11] Patent Number: 4,829,020
[45] Date of Patent: May 9, 1989

[54] SUBSTRATE SOLDER BARRIERS FOR SEMICONDUCTOR EPILAYER GROWTH

[75] Inventors: Timothy J. Drummond, Tijeras; David S. Ginley; Thomas E. Zipperian, both of Albuquerque, all of N. Mex.

[73] Assignee: The United States of America as represented by the United States Department of Energy, Washington, D.C.

[21] Appl. No.: 111,488

[22] Filed: Oct. 23, 1987

[51] Int. Cl.$^4$ ............................................. H01L 31/04
[52] U.S. Cl. ............................... 437/81; 148/DIG. 3; 148/DIG. 65; 148/DIG. 110; 148/DIG. 12; 148/33.3; 156/612; 156/DIG. 68; 428/627; 437/107; 437/95; 437/180; 437/245; 437/247; 437/902; 437/925
[58] Field of Search ................... 148/DIG. 12, 30, 36, 148/56, 65, 110, 169, 3, 33.3; 156/610-614; 228/121, 123, 124, 208; 428/621, 627, 624, 639; 437/81, 105, 95, 107, 209, 218, 245, 946, 925, 198, 247

[56] References Cited

U.S. PATENT DOCUMENTS

| | | | |
|---|---|---|---|
| 3,628,233 | 12/1971 | Sowko, Sr. | 228/124 |
| 3,883,946 | 5/1975 | Dale | 437/221 |
| 4,033,503 | 7/1977 | Fletcher et al. | 228/124 |
| 4,034,468 | 7/1977 | Koopman | 437/247 |
| 4,078,711 | 3/1978 | Bell et al. | 228/123 |
| 4,098,452 | 7/1978 | Webster et al. | 228/123 |
| 4,233,103 | 11/1980 | Shaheen | 228/123 |
| 4,312,896 | 1/1982 | Armstrong | 228/124 |
| 4,321,617 | 3/1982 | Duda et al. | 228/123 |
| 4,442,137 | 4/1984 | Kumar | 427/57 |
| 4,493,143 | 1/1985 | Maier | 437/209 |
| 4,493,856 | 1/1985 | Kumar et al. | 427/57 |
| 4,501,768 | 2/1985 | Kumar | 427/57 |
| 4,569,902 | 2/1986 | Saito | 430/313 |
| 4,582,722 | 4/1986 | Herron et al. | 427/57 |
| 4,709,655 | 12/1987 | Van Mastright | 118/723 |

FOREIGN PATENT DOCUMENTS 0093672  5/1986  Japan .

OTHER PUBLICATIONS

S. Yasuami, H. Mikami & A. Hojo, "Lattice Bending in LEC-Grown Semi-Insulating GaAs Wafers", *Japanese Journal of Applied Physics*, vol. 22, No. 10, Oct. 1983, pp. 1567-1569.

L. Erickson, G. Carpenter, D. Seibel & P. Palmberg, "Summary Abstract: MBE Film Growth by Direct Free Substrate Heating", *Journal Vacuum Science Technology*, B3(2), Mar./Apr. 1985, pp. 536-537.

J. Ding & J. Washburn, "In/GaAs Reaction: Effect of an Intervening Oxide Layer", *Applied Physics Letters*, 49(13), 29 Sep. 1986, pp. 818-820.

*Primary Examiner*—Brian E. Hearn
*Assistant Examiner*—William Bunch
*Attorney, Agent, or Firm*—George H. Libman; James H. Chafin; Judson R. Hightower

[57] ABSTRACT

During the growth of compound semiconductors by epitaxial processes, substrates are typically mounted to a support. In modular beam epitaxy, mounting is done using indium as a solder. This method has two drawbacks: the indium reacts with the substrate, and it is difficult to uniformly wet the back of a large diameter substrate. Both of these problems have been successfully overcome by sputter coating the back of the substrate with a thin layer of tungsten carbide or tungsten carbide and gold. In addition to being compatible with the growth of high quality semiconductor epilayers this coating is also inert in all standard substrate cleaning etchants used for compound semiconductors, and provides uniform distribution of energy in radiant heating.

20 Claims, No Drawings

SUBSTRATE SOLDER BARRIERS FOR SEMICONDUCTOR EPILAYER GROWTH

The United States Government has right in this invention under contract DE-AC04-76DP00789 between the United States Department of Energy and AT&T Technologies, Inc.

BACKGROUND OF THE INVENTION

An increasingly popular technique for the growth of compound semiconductor epilayers is molecular beam epitaxy (MBE). MBE is extremely versatile, offers atomic monolayer thickness control in the growth direction and the state of art is rapidly being advanced to the point where a commercial rather than a pure research application is feasible. The most immediate commercial application is the growth of AlGaAs/GaAs heterojunction structures from which optoelectronic and microwave devices or very high speed digital integrated circuits can be fabricated. Two serious drawbacks associated with the commercial application of MBE derive from the fact that substrate wafers are typically solder mounted on a refractory metal block during the growth process. First, it is difficult to ensure uniform wetting of the substrate to the solder for large (up to 3″ diameter) substrates. Second, the solder reacts with the substrate at the elevated temperatures required for crystal growth, generating substantial damage in the back surface of the substrate. This damage complicates the fabrication of integrated circuits which requires smooth and parallel front and back surfaces and reduces device yield by promoting the propagation of dislocations from the substrate into the epilayer during growth.

In the case of epilayer growth on GaAs substrates by MBE, commercially available substrates are typically 15 to 30 mils thick and at least two inches in diameter. Before being loaded into an MBE system they are mounted onto a molybdenum block coated with a thin film of indium which acts as a solder.

Historically, indium has been the solder of choice because it is a benign isoelectronic impurity in GaAs, it wets readily to GaAs (an alternative, pure gallium, does not) and it has a very low melting point. It has long been observed that indium reacts strongly with the back surface of the substrate creating a damaged nonplanar surface. At temperatures well below typical growth temperatures of GaAs, e.g., 580° C., the substrate dissolves into the indium solder and eventually recrystallizes as an alloy $In_xGa_{1-x}As$ with $x \leq 0.2$ or $x \geq 0.8$, J. Ding, J. Washburn, T. Sands and V. G. Keramidas, Appl. Phys. Lett., 49 (1986) 818. This implies that the back surface of the substrate after growth will not only be nonplanar but highly strained as well. If the substrate is strained during growth, then removal of the damaged layer on the back surface of the substrate prior to device fabrication will result in a strained and probably dislocated epilayer from which the devices will be fabricated, S. Ysuami, H. ikami and A. Hojo, Jpn. J. Appl. Phys., 22 (1983) 1567.

The kind of damage resulting from the solder alloying with the substrate is visible if the after growth surface of the substrate is etched to selectively remove only the metallic indium adhering to the substrate, revealing a significantly nonplanar surface. Before any device fabrication, integrated circuit or discrete device, the surface roughness must be removed by lapping with an abrasive grit. Extreme care must be taken not to damage the thin epilayer on the front which layer may be as thin as 150 nm. Care must also be taken to achieve parallel front and back surfaces. If the front surface is damaged, device yield suffers. If the two faces are not parallel, then the entire substrate is likely to be broken during the lithographic fabrication process which involves several contact printing steps. It is therefore desirable to maintain a smooth back surface during growth and avoid the necessity of lapping the substrate at all.

In addition, where the substrate is not solder-mounted but held, e.g., by clips, problems in epilayer growth occur if the heating, e.g., by direct radiant heating or infrared illumination, is not uniformly absorbed by the substrate. Furthermore, in the growth of refractory semiconductors on less refractory substrates, e.g., AlAs (grown at temperatures in excess of 800° C.) on GaAs (which decomposes in vacuum at 580° C.), in the absence of an In solder layer, direct radiant heating of the substrate will drive the decomposition of the back surface of the substrate by the rapid preferential evaporation of As from the crystal. In the case of a typical III-V compound semiconductor substrate, the Group V element always shows this type of behavior. It has been proposed in such a situation that the back surface of the substrate be coated with a layer of 2000 Å of sputter-deposited molybdenum. Erickson et al., J. Vac. Sci. Technol. B(3)2, March/April 1985, page 536. This presents additional difficulties, however, since the molybdenum is rapidly removed by the standard $H_2SO_4/H_2O_2/H_2O$ etch used in substrate preparation, thereby necessitating the less desirable sequence of etching the substrate before depositing the molybdenum.

SUMMARY OF THE INVENTION

It is therefore an object of the invention to provide a substrate solder barrier effective to reduce damage to the substrate caused by alloying of the substrate and solder in epitaxial growth, and by chemical etches used in substrate preparation. It is also an object to provide a process for increasing efficiency of radiant heating and eliminating thermal decomposition of substrates during growth employing direct radiant heat.

Upon further study of the specification and appended claims, further objects and advantages of this invention will become apparent to those skilled in the art.

These objects have been satisfied by the provision of a semiconductor surface having thereon a layer of tungsten carbide. The tungsten carbide layer may be further coated with a gold layer. The objects are further satisfied by the provision of a method of protecting a surface of a semiconductor from attack from a substance applied thereto, comprising applying a layer of tungsten carbide to said surface prior to contact with said substance.

DETAILED DISCUSSION

To avoid a reaction between the substrate and the solder, the diffusion barrier should be deposited on the substrate prior to mounting. The diffusion barrier should meet four criteria. First, it should be chemically inert to both the substrate and solder at conventional growth temperatures. Second, it should be chemically inert in the etchants used to prepare the front surface before crystal growth. Third, the solder of choice should wet it. Fourth, doping of the epilayers by small quantities of the diffusion barrier escaping from beneath the crystal during growth should not occur; otherwise, electrical degradation of the grown crystal might result.

The present diffusion barriers meet the above criteria. The barriers consist of a metallization which may be sputter deposited onto the substrate and is composed of a layer of about 10-200 nm of tungsten carbide (WC) deposited directly on the substrate; this layer may be followed by a layer of about 10-50 nm of gold (Au). Preferred thicknesses are about 50 nm each of WC and Au.

Suitable substrates include all those conventionally used in semiconductor fabrication involving elements of Groups II, III, IV, V and VI, for example, and binary, tertiary, etc., compounds thereof. Substrates of indium/antimony, indium/arsenic, indium/phosphorus and gallium/arsenic are preferred. GaAs is particularly preferred. Suitable solders include all those conventionally useful in epitaxial growth processes. Gallium, indium and alloys thereof are preferred. Indium is particularly preferred.

With respect to the metallization layer, WC alone meets three of the above requirements but does not wet In. The Au layer enables wetting to any solder. It also dissolves into the solders, e.g., into In, during growth so that subsequent removal of the Au is not a problem. Therefore, when In is the solder of choice, the Au layer is also preferably applied as it is when WC does not wet the solder. Since a planar back surface is maintained, by the process according to the invention, removal of the barrier layer is not necessary where no growth of epilayers on the back surface is desired or it does not otherwise interfere with subsequent processing.

Deposition of the metal layers may be by conventional sputtering techniques, by ink jet or chemical vapor deposition. All of these methods are fully conventional. Where desired, the metallization may be removed by conventional chemical etching. Etches may include $HF/HNO_3$, $HF/HNO_3/H_2O$ or aqua regia. Sputter etching, e.g., with argon, is also effective.

Except for the use of the WC or WC/Au layer according to the invention, epitaxial growth procedures are fully conventional. Molecular beam epitaxy is preferred.

In addition to maintaining a planar substrate back surface during the growth of compound semiconductor epilayers, the diffusion barrier of the invention can be used to advantage in commercial MBE and other systems that employ direct radiant heating of the substrate rather than solder mounting. GaAs substrates, for example, couple very weakly to radiant heat sources when the equivalent blackbody temperature is much less than 2000 K. WC is essentially opaque throughout the infrared spectrum and greatly increases the efficiency of optical coupling to the substrate allowing for more efficient heating. The WC layer also passivates the back surface of the substrate with respect to thermal decomposition in those cases where extremely high growth temperatures are routinely employed. Deposition is according to the discussion above. Optimum thickness can readily be determined by one of ordinary skill in the art with only routine testing. Preferably, the WC layer is 10-200 nm, more preferably 50 nm. To estimate the minimum WC thickness necessary for an application, routine tests will determine the total absorbance of deposited WC films as a function of film thickness for two different wavelengths. For example, for a 100 nm thick sputtered film 98% of the incident radiation is absorbed. Gold, which has an IR-reflecting effect, will not be used in this application.

A further application of the invention is improved control over back surface planarity during pregrowth substrate preparation. In some applications growth is on (111) oriented substrates. Growth is usually performed on the (111)B face with the (111)A face of the substrate mounted against the block. The (111)A face is, however, highly reactive in all conventional etches, and the pregrowth etching generates a nonplanar surface even before the substrate is solder mounted. In this application, the diffusion barrier protects the back surface during pregrowth processing as well as during growth. Application of the barrier, e.g., thickness and composition, is determined by the desired purpose, as a solder barrier or thermal coupler, in accordance with the criteria discussed above.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the preceding text and the following examples, all temperatures are set forth uncorrected in degrees Celsius and all parts and percentages are by weight, unless otherwise indicated.

EXAMPLE 1

Si-doped GaAs epilayers were grown under identical conditions on substrates cut from the same GaAs ingot, the only difference being that one of the substrates was coated with a WC/Au diffusion barrier prior to etching and mounting the substrate. The diffusion barrier was deposited on degreased GaAs substrates in a Perkin-Elmer 2400-6J rf sputtering system using oxygen-free argon as the sputter gas. WC was sputtered at 100 W with 10% bias at a rate of 7 nm/min and Au was sputtered at 50 W with 10% bias at 30.2 nm/min. The system was equipped with multiple targets, so the substrates were not exposed to air between coatings. The substrates were held on a highly polished, thermally sunk, Au coated copper block to prevent front surface damage. After deposition of the diffusion barrier the substrates were subject to conventional MBE pregrowth treatment. Substrate preparation consisted of degreasing the substrate in boiling trichloroethylene, rinsing with acetone, methanol and water, etching in 5 $H_2SO_4$ :1 $H_2O_2$:1 $H_2O$ followed by a water rinse, a hydrochloric acid bath and a final water rinse. After blowing the substrates dry with nitrogen gas each substrate was In solder mounted on a molybdenum block at 300° C. The substrates were then immediately loaded into an MBE system. The preceding operations are standard for GaAs substrates.

The epilayer structure consisted of a 1 um thick undoped buffer layer followed by 3 um of Si-doped GaAs. The GaAs was grown at 570° C. under an As/Ga flux ratio of 2 as determined by an ion gauge beam flux monitor rotated into the growth position. The resulting layers were characterized by the van der Pauw-Hall technique at 300 K and 77 K. The data are given in the table. The coated substrate shows a slightly higher carrier density with slightly lower mobilities. Data from both samples are consistent with a compensation ratio of 2. Since the growth system does not have substrate rotation, the epilayers are somewhat nonuniform, and the results are identical within experimental error.

TABLE

| Substrate | u(300 K) (cm$^2$/Vs) | n(300 K) (cm$^{-3}$) | u(77 K) (cm$^2$/Vs) | n(77 K) (cm$^{-3}$) |
|---|---|---|---|---|
| Coated | 5490 | 3.4 × 10$^{16}$ | 9170 | 2.7 × 10$^{16}$ |
| Uncoated | 5560 | 2.7 × 10$^{16}$ | 9550 | 2.2 × 10$^{16}$ |

(Hall mobility and carrier density measured in nominally identical epitaxial films grown on substrates with (coated) and without (uncoated) a WC/Au diffusion barrier.)

In connection with the Hall data above, it is relevant to consider the potential effect of W, C or Au unintentionally incorporated into the MBE grown epilayer. All three impurities form acceptor levels in GaAs. W and Au form deep levels and C a shallow level. Because the WC/Au coating layer was buried in the indium solder, no measurable amount of any of the three elements escapes from beneath the substrate to incorporate at the growing crystal surface. The only reasonable means of transport to the epilayer would be diffusion through the substrate. The possibility of WC diffusing through the substrate is highly unlikely, as is the likelihood of dissociating the WC bond to form either of the elemental constituents. The ability of Au to diffuse into the substrate is limited by the presence of the WC barrier and the dissolution of most of the Au into the In. Even if the Au was uninhibited in its diffusion into the substrate, the solid solubility of Au in GaAs at the growth temperature is at most $6 \times 10^{13}$/cm$^3$, less than the total background impurity concentration in the highest purity MBE grown GaAs reported to date, V. I. Sokolov and F. S. Shishiyanu, Sov. Phys. Sol. St., 6 (1964) 265, E. C. Larkins, E. S. Hellman, D. G. Schlom, J. S. Harris, Jr., M. H. Kim and G. 340 E. Stillman, Appl. Phys. Lett., 49 (1986) 391.

EXAMPLE 2

Surface roughness profiles of the post-growth back surfaces of chemically cleaned coated and uncoated substrates are generated by scanning electron micrography. In is first removed with concentrated hydrochloric acid. The micrographs reveal for the etched uncoated substrate a faceted surface indicating the formation of crystalline InGaAs over the back of the substrate. The coated substrate has a peak-to-peak surface roughness of approximately 0.5 um with no InGaAs growth while the uncoated substrate has a peak-to-peak roughness of approximately 40 um. A zero reference for the uncoated substrate is arbitrary. In addition to solder damage, the conventional pregrowth cleaning etch removes some of the substrate and is responsible for additional roughness. In most research laboratories, substrates are etched in fixtures where the etch cannot flow freely between the back of the substrate and the bottom of the fixture. Application of WC protects the back of the substrate from the consequent nonuniform etching.

From the results above, it is obvious that a surface smooth enough to allow for immediate device processing has been obtained by coating the substrate with WC.

EXAMPLE 3

Recognizing that certain processes may require removal of the WC without lapping the substrate, several etching procedures were investigated. A white etch (1 HF:3 HNO$_3$) was found to be dependent on the thickness of the WC with a maximum rate of 74 nm/sec for WC 660-290 nm thick, decreasing to 3.5 nm/sec for WC 0-200 nm thick. A white etch consisting of 1 HF:3 HNO$_3$:2 H$_2$O is a standard chemical polish for GaAs with an etch rate of 580 nm/sec. Aqua regia was found to etch WC at a rate of 27 nm/sec. Finally, sputter etching with Ar was investigated. At 100 W over a 6-inch table and 20 um of Ar the etch rate was 6.3±1.2 nm/sec.

The preceding examples can be repeated with equal success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A semiconductor substrate having opposed front and back surfaces;
   said front surface defining means for receiving additional layers during epitaxial growth;
   said back surface having thereon a diffusion barrier comprising a layer of tungsten carbide;
   said substrate being mounted on a substrate holder for subsequent growth of epitaxial layers on said front surface.

2. A semiconductor substrate according to claim 1, wherein the tungsten carbide layer has a thickness of about 10-200 nm.

3. A semiconductor substrate according to claim 1, wherein the tungsten carbide layer has a thickness of about 50 nm.

4. A semiconductor substrate according to claim 1, wherein said tungsten carbide layer has thereon a layer of a metal effective to wet said tungsten carbide to a solder.

5. A semiconductor substrate according to claim 4, wherein the metal effective to wet said tungsten carbide substrate is gold.

6. A semiconductor substrate according to claim 5, wherein the gold layer has a thickness of about 10-50 nm.

7. A semiconductor substrate according to claim 5 wherein the gold layer has a thickness of about 50 nm.

8. A semiconductor substrate according to claim 4, wherein said metal layer has thereon a solder effective to mount said semiconductor substrate to a support.

9. A semiconductor substrate according to claim 8, wherein the solder is indium, gallium, or an alloy thereof.

10. A semiconductor substrate according to claim 8, wherein the solder is indium.

11. A method of protecting a back substrate of a semiconductor substrate mounted on a substrate holder from attack from a substance in contact with said surface during epitaxial growth on an opposed front surface, comprising applying a layer of tungsten carbide to said back surface prior to contact with said substance.

12. A method according to claim 11, further comprising applying a layer of a metal effective to wet said tungsten carbide to a solder.

13. A method according to claim 12, wherein the metal is gold.

14. A method according to claim 11, wherein the substance applied is a solder.

15. A method according to claim 11, wherein the substance applied is a chemical etch.

16. A method according to claim 14, wherein the solder is indium, gallium, or an alloy thereof.

17. In a process for epitaxial growth on a semiconductor substrate mounted by its back surface on a support, the improvement comprising using as the substrate a semiconductor whose back surface has thereon a layer of tungsten carbide.

18. A process according to claim 17, wherein the layer of tungsten carbide further has thereon a layer of a metal effective to wet said tungsten carbide to a solder.

19. A process according to claim 18, wherein the metal effective to wet said semiconductor surface is gold.

20. A method of increasing the efficiency of the coupling of optical energy into thermal energy and of passivating a semiconductor substrate against thermal decomposition during direct radiant heating of a semiconductor during irradiating with said surface of said optical energy, comprising applying a layer of tungsten carbide to said substrate prior to said irradiating.

* * * * *